United States Patent
Boyd et al.

(10) Patent No.: US 10,482,010 B2
(45) Date of Patent: Nov. 19, 2019

(54) PERSISTENT HOST MEMORY BUFFER

(71) Applicant: Intel Corporation, Santa Clara, CA (US)

(72) Inventors: James A. Boyd, Hillsboro, OR (US); John W. Carroll, Portland, OR (US); Sanjeev N. Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 15/637,516

(22) Filed: Jun. 29, 2017

(65) Prior Publication Data
US 2019/0004940 A1 Jan. 3, 2019

(51) Int. Cl.
G11C 7/10 (2006.01)
G06F 12/02 (2006.01)
G06F 12/06 (2006.01)
G06F 13/16 (2006.01)

(52) U.S. Cl.
CPC ...... G06F 12/0246 (2013.01); G06F 12/0623 (2013.01); G06F 13/1673 (2013.01); G06F 13/1689 (2013.01); G06F 13/1694 (2013.01); G11C 7/1006 (2013.01)

(58) Field of Classification Search
CPC ............. G06F 12/0246; G06F 12/0623; G06F 13/1673; G06F 13/1689; G06F 13/1694; G11C 7/1006
See application file for complete search history.

(56) References Cited

U.S. PATENT DOCUMENTS

| | | | |
|---|---|---|---|
| 7,231,497 B2 | 6/2007 | Trika et al. | |
| 7,640,395 B2 * | 12/2009 | Coulson | G06F 12/0804 711/113 |
| 7,664,889 B2 * | 2/2010 | Vemula | G06F 13/28 710/22 |
| 7,710,968 B2 * | 5/2010 | Cornett | H04L 49/90 370/392 |
| 7,770,088 B2 * | 8/2010 | Sarangam | H04L 1/1685 370/394 |
| 8,195,891 B2 * | 6/2012 | Trika | G06F 11/1441 711/135 |
| 8,239,613 B2 | 8/2012 | Trika et al. | |
| 8,898,388 B1 * | 11/2014 | Kimmel | G06F 12/0802 711/103 |
| 9,244,848 B2 * | 1/2016 | Boyd | G06F 12/0868 |
| 9,418,011 B2 * | 8/2016 | Soares | G06F 12/0862 |
| 9,448,922 B2 | 9/2016 | Trika et al. | |
| 2004/0083405 A1 * | 4/2004 | Chang | G06F 11/0763 714/24 |
| 2005/0091445 A1 * | 4/2005 | Chang | G06F 12/0246 711/103 |
| 2005/0144367 A1 * | 6/2005 | Sinclair | G06F 12/0246 711/103 |
| 2005/0195635 A1 * | 9/2005 | Conley | G06F 12/0862 365/149 |

(Continued)

Primary Examiner — Shawn X Gu
Assistant Examiner — Andrew J Cheong
(74) Attorney, Agent, or Firm — Jordan IP Law, LLC

(57) ABSTRACT

An embodiment of a memory apparatus may include a persistent host memory buffer, and a memory controller communicatively coupled to the persistent host memory buffer to control communication between the persistent host memory buffer and a persistent storage media device. Other embodiments are disclosed and claimed.

12 Claims, 6 Drawing Sheets

| | Soft Binding | Permanent Binding |
|---|---|---|
| Fast boot/resume | Y | Y |
| Cost reduction of SSD | Y | Y |
| Power/Bill of Materials reduction due to DRAM elimination | Y | Y |
| Performance improvement | N | Y |
| Power/performance due to write back caching (instead of write through) | N | Y |

(56) References Cited

U.S. PATENT DOCUMENTS

| | | | |
|---|---|---|---|
| 2012/0159289 A1* | 6/2012 | Piccirillo | G06F 1/30 |
| | | | 714/799 |
| 2012/0173837 A1* | 7/2012 | Schneider | G06F 12/0802 |
| | | | 711/170 |
| 2012/0210115 A1* | 8/2012 | Park | H04L 9/3242 |
| | | | 713/2 |
| 2014/0281703 A1* | 9/2014 | Tekumalla | G06F 11/10 |
| | | | 714/15 |
| 2015/0356020 A1* | 12/2015 | Desai | G06F 12/0868 |
| | | | 711/103 |
| 2016/0026406 A1* | 1/2016 | Hahn | G06F 3/0631 |
| | | | 711/103 |
| 2016/0139982 A1* | 5/2016 | Yu | G11C 14/0018 |
| | | | 714/768 |
| 2016/0209890 A1* | 7/2016 | Rose | G06F 21/79 |
| 2016/0246726 A1* | 8/2016 | Hahn | G06F 12/0862 |
| 2016/0246807 A1* | 8/2016 | Yu | G11C 14/0018 |
| 2016/0274797 A1* | 9/2016 | Hahn | G06F 3/0605 |
| 2016/0291883 A1* | 10/2016 | Manohar | G06F 3/0613 |
| 2017/0003981 A1* | 1/2017 | Erez | G06F 9/4418 |
| 2017/0031811 A1* | 2/2017 | Fu | G06F 12/0246 |
| 2017/0075813 A1* | 3/2017 | Kaburaki | G06F 12/0897 |
| 2017/0083454 A1* | 3/2017 | Ramalingam | G06F 12/1081 |
| 2017/0102879 A1* | 4/2017 | Benisty | G06F 3/0604 |
| 2017/0116117 A1* | 4/2017 | Rozen | G06F 12/0607 |
| 2017/0123659 A1* | 5/2017 | Nam | G06F 3/061 |
| 2017/0123946 A1* | 5/2017 | Wu | G06F 11/2094 |
| 2017/0131917 A1* | 5/2017 | Yun | G06F 3/0611 |
| 2017/0206030 A1* | 7/2017 | Woo | G06F 3/0623 |
| 2017/0242606 A1* | 8/2017 | Vlaiko | G06F 3/0625 |
| 2017/0285940 A1* | 10/2017 | Benisty | G06F 3/061 |
| 2017/0351452 A1* | 12/2017 | Boyd | G06F 3/0631 |

* cited by examiner

|  | Soft Binding | Permanent Binding |
|---|---|---|
| Fast boot/resume | Y | Y |
| Cost reduction of SSD | Y | Y |
| Power/Bill of Materials reduction due to DRAM elimination | Y | Y |
| Performance improvement | N | Y |
| Power/performance due to write back caching (instead of write through) | N | Y |

FIG. 5

PERSISTENT HOST MEMORY BUFFER

TECHNICAL FIELD

Embodiments generally relate to memory systems. More particularly, embodiments relate to a persistent host memory buffer.

BACKGROUND

A computing system may include various types of memory and/or various types of storage devices. A host system may include dynamic random access memory (DRAM). A storage device such as a solid state drive (SSD) may be coupled to a host system.

BRIEF DESCRIPTION OF THE DRAWINGS

The various advantages of the embodiments will become apparent to one skilled in the art by reading the following specification and appended claims, and by referencing the following drawings, in which:

FIG. 5 is a table of an example of soft binding versus permanent binding according to an embodiment.

DESCRIPTIONS OF EMBODIMENTS

Various embodiments described herein may include a memory component and/or an interface to a memory component. Such memory components may include volatile and/or nonvolatile memory. Nonvolatile memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional cross point memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), PCM with switch (PCMS), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as DRAM or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

Figure 1:
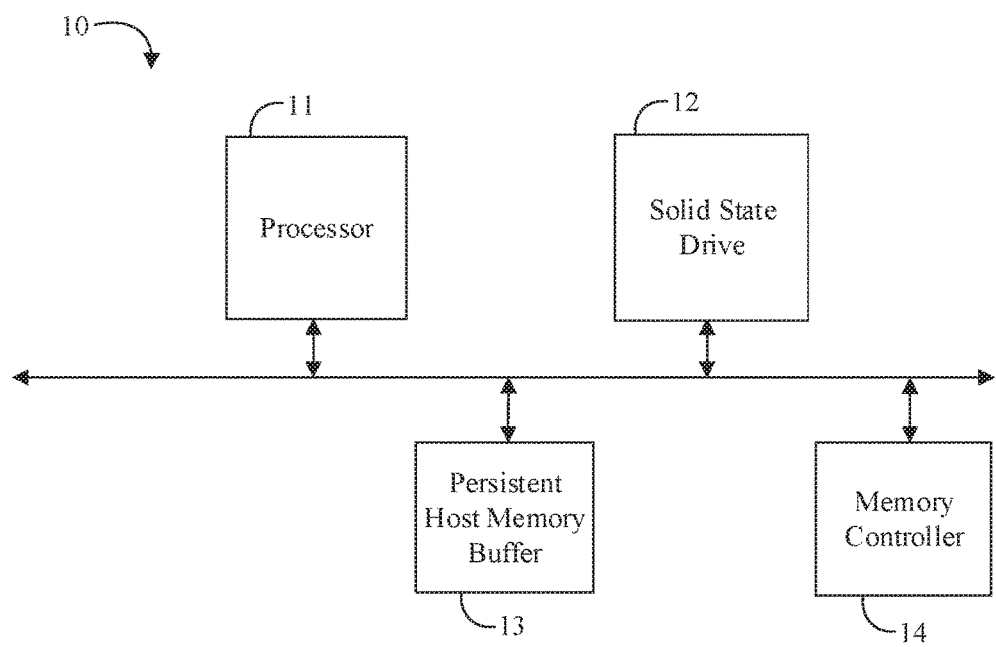
FIG. 1 is a block diagram of an example of an electronic processing system according to an embodiment.

Turning now to FIG. 1, an embodiment of an electronic processing system 10 may include a processor 11, a SSD 12 communicatively coupled to the processor 11, a persistent host memory buffer (PHMB) 13 communicatively coupled to the processor 11 and the SSD 12 (e.g. where the PHMB 13 may be permanently allocated to the SSD 12), and a memory controller 14 communicatively coupled to the processor 11, the SSD 12, and the PHMB 13 to control communication between the SSD 12 and the PHMB 13 (e.g. as described in more detail below). In some embodiments, the memory controller 14 may be configured to extend the SSD 12 with the PHMB 13. For example, the memory controller 14 may be configured to utilize the PHMB 13 as a write-back cache for the SSD 12. In some embodiments, the SSD 12 may be coupled to the processor 11 via an input/output (IO) interface such as PCI EXPRESS (PCIe), NVM EXPRESS (NVMe), etc. In some embodiments, the memory controller 14 may be coupled between the processor 11 and various memory components (e.g. SSD 12, PHMB 13, etc.).

In some embodiments of the system 10, the memory controller 14 may be further configured to pair the PHMB 13 with the SSD 12. For example, the memory controller 14 may be configured to pair the PHMB 13 with the SSD 12 with one of a soft binding and/or a permanent binding. In any of the embodiments described herein, the memory controller 14 may be further configured to save a signature in the PHMB 13 and/or the SSD 12 prior to power down and verify the saved signatures on power restoration.

Embodiments of each of the above processor 11, SSD 12, PHMB 13, memory controller 14, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine-or computer-readable storage medium such as RAM, read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the SSD 12, PHMB 13, other persistent storage media, or other system memory may store a set of instructions which when executed by the processor 11 cause the system 10 to implement one or more components, features, or aspects of the system 10 (e.g., the memory controller 14, etc.).

Figure 2:
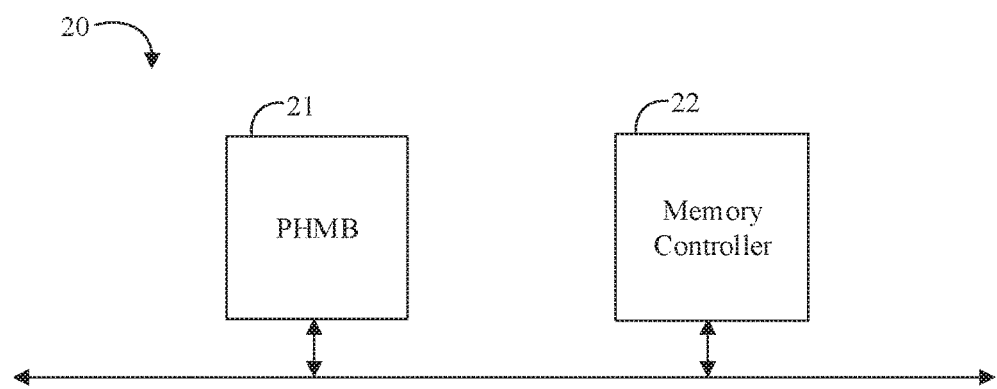
FIG. 2 is a block diagram of an example of a memory apparatus according to an embodiment.

Turning now to FIG. 2, an embodiment of a memory apparatus 20 may include a PHMB 21, and a memory controller 22 communicatively coupled to the PHMB 21 to control communication between the PHMB 21 and a persistent storage media device. In some embodiments, the memory controller 22 may be configured to extend the persistent storage media device with the PHMB 21. For example, the memory controller 22 may be configured to utilize the PHMB 21 as a write-back cache for the persistent storage media device. In some embodiments, the memory controller 22 may be further configured to pair the PHMB 21 with the persistent storage media device. For example, the memory controller 22 may be configured to pair the PHMB 21 with the persistent storage media device with one of a soft binding and/or a permanent binding. In any of the embodiments, the memory controller 22 may be further configured to save a signature in the PHMB 21 and/or the persistent storage media device prior to power down and verify the saved signatures on power restoration.

Embodiments of each of the above PHMB 21, memory controller 22, and other components of the apparatus 20 may be implemented in hardware, software, or any combination thereof. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Alternatively, or additionally, these components may be implemented in one or more modules as a set of logic instructions stored in a machine-or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 3A:
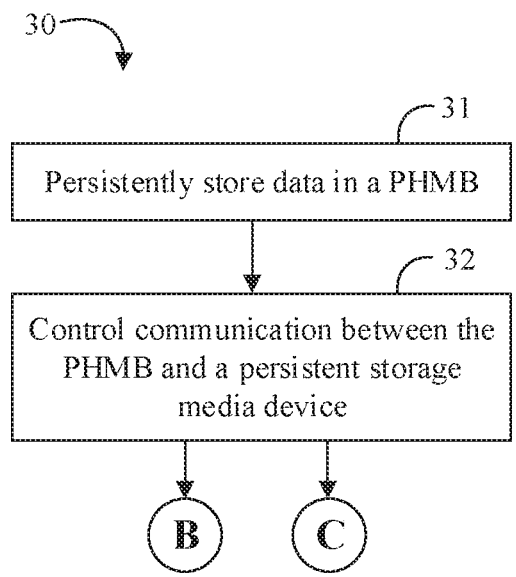
FIGS. 3A to 3C are flowcharts of an example of a method of controlling memory according to an embodiment.
Figure 3B:
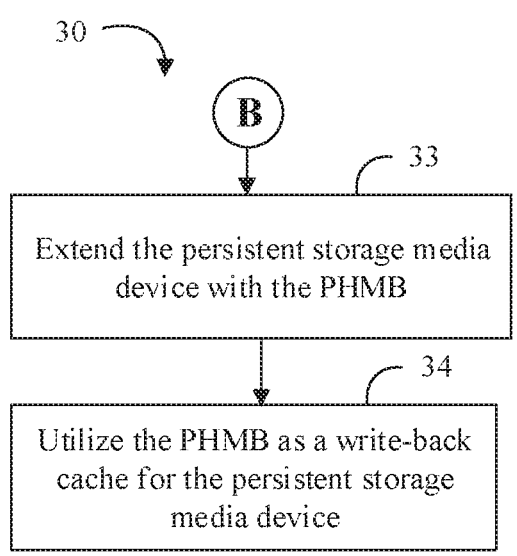
Figure 3C:
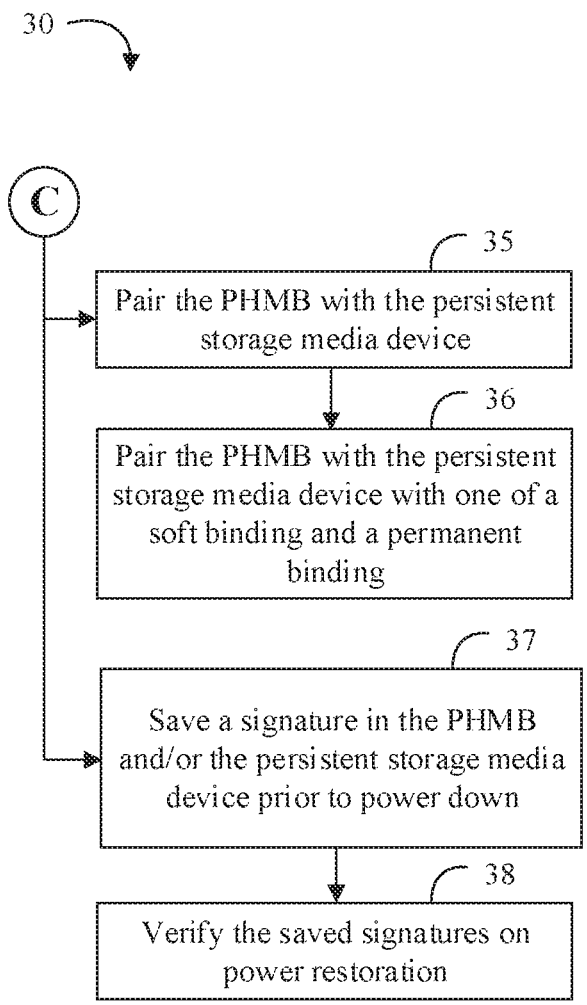

Turning now to FIGS. 3A to 3C, an embodiment of a method 30 of controlling memory may include persistently storing data in a PHMB at block 31, and controlling communication between the PHMB and a persistent storage media device at block 32. Some embodiments of the method 30 may include extending the persistent storage media device with the PHMB at block 33. For example, the method 30 may include utilizing the PHMB as a write-back cache for the persistent storage media device at block 34.

In some embodiments, the method 30 may also include pairing the PHMB with the persistent storage media device at block 35. For example, the method 30 may include pairing the PHMB with the persistent storage media device with one of a soft binding and a permanent binding at block 36. The method 30 may also include saving a signature in the PHMB and/or the persistent storage media device prior to power down at block 37, and verifying the saved signatures on power restoration at block 38.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages. For example, the method 30 may be implemented on a computer readable medium as described in connection with Examples 19 to 24 below. For example, embodiments or portions of the method 30 may be implemented in applications (e.g., through an application programming interface (API)) or driver software running on an operating system (OS).

Some embodiments may provide a PHMB for performance enhancement and/or cost reduction. For example, some embodiments may utilize persistent memory as a host memory buffer to provide an extension of the device storage. Some embodiments may permanently allocate persistent memory from a host platform to a storage device to be used as a buffer. Advantageously, this pairing/allocation may improve performance and/or power while reducing overall platform cost.

Some other systems incorporating a SSD device may use a buffer in host DRAM, sometimes referred to as a host memory buffer (HMB), to store temporary data (e.g., for write-through caching or indirection-tables). The data in the HMB, however, is volatile, and is lost on every power-cycle. The device/driver is responsible for saving any data that is required to be persistent to non-volatile media at the right time, and to restore it on a next power-cycle.

Some embodiments may advantageously provide a PHMB for use by the SSD device, to reduce or eliminate the need for such synch/restore operations. The PHMB may also significantly improve performance by enabling device managed write-back caching in the PHMB. In some embodiments, the host may allow the storage device to directly or indirectly control the PHMB. A storage device controlled PHMB may allow for tight platform integration of storage and memory to improve performance. For example, a platform specifically designed with persistent memory may choose a lower cost storage device that requires or benefits from PHMB to function fully. The cost of the overall storage solution can be lower because the storage device may be designed with fewer components. An example storage device may include an INTEL PCI EXPRESS (PCIe) 3D NAND device.

In some embodiments, the storage device may be configured to detect or determine if the host memory buffer is persistent. The storage device may further detect or determine if the PHMB is permanently bound and, if so, may utilize the host memory buffer as an extension of the storage device (e.g., including as a device write-back cache) which may improve system performance and power utilization. As compared to a host software based storage caching solution, having the storage device manage the PHMB in accordance with some embodiments may advantageously be OS independent. Whether UEFI, LINUX, WINDOWS, etc., the storage device may not be tied to a particular software model and the PHMB may be utilized in any environment.

Some hybrid drives may include a single device with differing media types. But such hybrid devices may incur extra costs to manufacture and include multiple media types, which may have separate controllers to manage each type of media. In accordance with some embodiments, providing the PHMB in the host platform may provide the benefit of a hybrid-type experience without the cost of fast non-volatile media being placed on the storage device (e.g., or multiple storage devices coupled to the same host).

Figure 4:
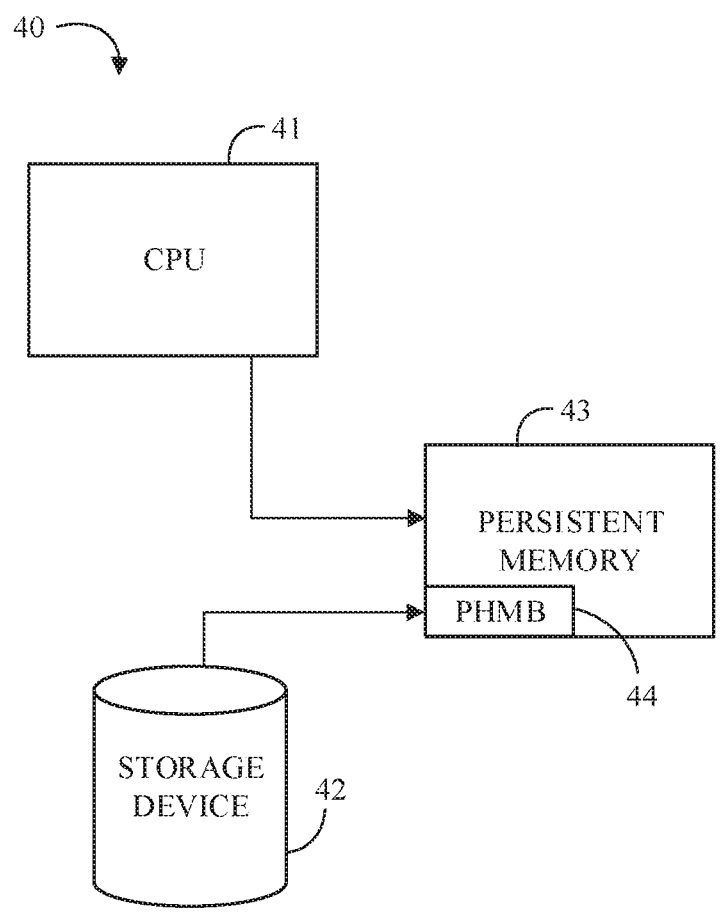
FIG. 4 is a block diagram of an example of a platform according to an embodiment.

Turning now to FIG. 4, an embodiment of a platform 40 may include a host CPU 41, a storage device 42, and persistent memory 43 coupled between the host CPU 41 and the storage device 42. The storage device 42 may include, for example, a triple-level cell (TLC) NAND device. A portion of the persistent memory 43 may be allocated to a PHMB 44. For example, the platform 40 may allocate/set aside a range of addresses from the persistent memory 43 to provide to the storage device 42 for the PHMB 44. The address range may be provided to the device with an indicator that the memory is persistent and the storage device 42 can be guaranteed that the PHMB 44 will always be present and data not lost across platform power cycles/power loss.

For a subsequent power on, in some embodiments, the storage device 42 may check to see if the same PHMB 44 has been provided back via signature checks the storage device 42 may have written on the previous power down (e.g., to ensure no platform/device separation) and/or may check the PHMB 44 contents for validity. Such checks may be for data integrity and/or security concerns. If the storage device 42 determines that it is connected to the same PHMB 44, the storage device 42 advantageously may no longer need to repopulate the PHMB 44 with data on every power cycle or ensure that the data in the PHMB 44 is flushed/cleaned when the storage device 42 is powered down. If the signature within the PHMB 44 is incorrect (e.g., or not populated) the storage device 42 may fail to power up (e.g., to avoid data corruption). In some embodiments, the storage device 42 may power up fully only when returned to the same platform 40 and a matching signature within the PHMB 44 is provided.

Advantageously, providing the PHMB 44 in the platform 40 may reduce the cost of the storage device 42, because the storage device 42 may retain more memory and storage to utilize, while still providing the benefits of a higher costing device. Additionally, or alternatively, some embodiments may save time and/or bandwidth on platform power up. For example, the storage device 42 may initialize and continue utilizing the data in the PHMB 44 immediately without going through steps to repopulate the PHMB 44. Because some PHMBs may be multiple gigabytes (GBs) in size, not having to repopulate the PHMB 44 may save time reading the content from the storage medium and into memory.

Turning now to FIG. 5, an illustrative table indicates two non-limiting examples of how a PHMB may be paired with a storage device. One example may be referred as soft binding. Soft binding may include techniques that allows a virtual pairing via software (e.g., which may be undone at any time). The storage device and the PHMB may be associated, but one or both may physically or logically be removed from the platform. Another example may be referred to as permanent binding. Permanent binding may include techniques that allows a pairing of the devices, but neither may be expected to be physically removed from the platform (e.g., soldered down components). Soft binding may support a reduced feature set as compared to permanent binding.

Depending on the binding type, the storage device may utilize the persistent memory differently as shown in the table from FIG. 5. For performance reasons, for example, the PHMB may be used as a storage device cache (managed by the storage device). In the example of soft binding, it may be better to not use the PHMB as a write-back cache because the PHMB and the storage device may be separated. On the other hand, for the example of permanent binding the PHMB and the storage device are not expected to be separated, and thus there is less risk of data loss and the PHMB may safely be utilized as a write-back cache for the storage device. For example, some embodiments of a system including the PHMB may be utilized in combination with INTEL RST (RAID chipset) software, RSTe (Enterprise RAID), caching acceleration software, INTEL NSG storage devices (e.g., 3D)(POINT Technology and 3D NAND solutions), etc.

Figure 6:
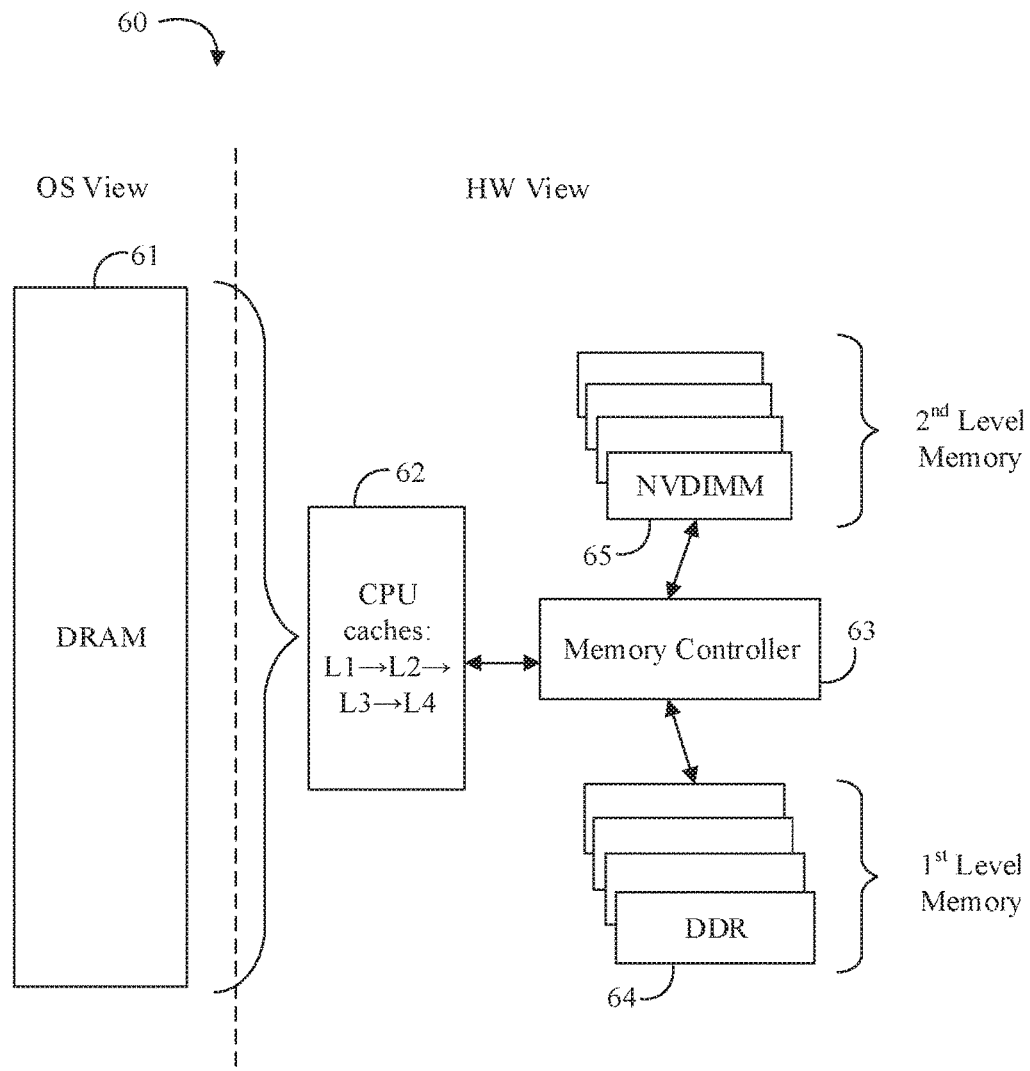
FIG. 6 is an illustrative diagram of a two-level memory (2LM) system according to an embodiment.

Turning now to FIG. 6, an embodiment of a 2LM system 60 may include an operating system (OS) view where memory appears as a contiguous range of DRAM 61 and a hardware (HW) view which includes various CPU caches (e.g. L1, L2, etc.) 62 which may interface with a memory controller 63 to access information stored in a first level memory 64 and/or a second level memory 65. For example, the first level memory 64 may include one or more DDR-based memory devices while the second level memory 65 may include one or more NVDIMM devices. In some embodiments, a portion of the non-volatile memory (e.g. the NVDIMM devices) may be allocated as a PHMB. For example, the system 60 may allocate/set aside a range of addresses from the second level memory 65 to provide to a connected storage device for the allocated PHMB. The address range may be provided to the device with an indicator that the memory is persistent and the storage device can be guaranteed that the PHMB will always be present and data not lost across platform power cycles/power loss.

Additional Notes and Examples

Example 1 may include an electronic processing system, comprising a processor, a solid state drive communicatively coupled to the processor, a persistent host memory buffer communicatively coupled to the processor and the solid state drive, and a memory controller communicatively coupled to the processor, the solid state drive, and the persistent host memory buffer to control communication between the solid state drive and the persistent host memory buffer.

Example 2 may include the system of Example 1, wherein the memory controller is further to extend the solid state drive with the persistent host memory buffer.

Example 3 may include the system of Example 2, wherein the memory controller is further to utilize the persistent host memory buffer as a write-back cache for the solid state drive.

Example 4 may include the system of Example 1, wherein the memory controller is further to pair the persistent host memory buffer with the solid state drive.

Example 5 may include the system of Example 4, wherein the memory controller is further to pair the persistent host memory buffer with the solid state drive with one of a soft binding and a permanent binding.

Example 6 may include the system of any of Examples 1 to 5, wherein the memory controller is further to save a signature in the persistent host memory buffer and the solid state drive prior to power down and verify the saved signatures on power restoration.

Example 7 may include a memory apparatus, comprising a persistent host memory buffer, and a memory controller communicatively coupled to the persistent host memory buffer to control communication between the persistent host memory buffer and a persistent storage media device.

Example 8 may include the apparatus of Example 7, wherein the memory controller is further to extend the persistent storage media device with the persistent host memory buffer.

Example 9 may include the apparatus of Example 8, wherein the memory controller is further to utilize the persistent host memory buffer as a write-back cache for the persistent storage media device.

Example 10 may include the apparatus of Example 7, wherein the memory controller is further to pair the persistent host memory buffer with the persistent storage media device.

Example 11 may include the apparatus of Example 10, wherein the memory controller is further to pair the persistent host memory buffer with the persistent storage media device with one of a soft binding and a permanent binding.

Example 12 may include the apparatus of any of Examples 7 to 11, wherein the memory controller is further to save a signature in the persistent host memory buffer and the persistent storage media device prior to power down and verify the saved signatures on power restoration.

Example 13 may include a method of controlling memory, comprising persistently storing data in a persistent host memory buffer, and controlling communication between the persistent host memory buffer and a persistent storage media device.

Example 14 may include the method of Example 13, further comprising extending the persistent storage media device with the persistent host memory buffer.

Example 15 may include the method of Example 14, further comprising utilizing the persistent host memory buffer as a write-back cache for the persistent storage media device.

Example 16 may include the method of Example 13, further comprising pairing the persistent host memory buffer with the persistent storage media device.

Example 17 may include the method of Example 16, further comprising pairing the persistent host memory buffer with the persistent storage media device with one of a soft binding and a permanent binding.

Example 18 may include the method of any of Examples 13 to 17, further comprising saving a signature in the persistent host memory buffer and the persistent storage media device prior to power down, and verifying the saved signatures on power restoration.

Example 19 may include at least one computer readable medium, comprising a set of instructions, which when executed by a computing device, cause the computing device to persistently store data in a persistent host memory buffer, and control communication between the persistent host memory buffer and a persistent storage media device.

Example 20 may include the at least one computer readable medium of Example 19, comprising a further set of instructions, which when executed by the computing device, cause the computing device to extend the persistent storage media device with the persistent host memory buffer.

Example 21 may include the at least one computer readable medium of Example 20, comprising a further set of instructions, which when executed by the computing device, cause the computing device to utilize the persistent host memory buffer as a write-back cache for the persistent storage media device.

Example 22 may include the at least one computer readable medium of Example 19, comprising a further set of instructions, which when executed by the computing device, cause the computing device to pair the persistent host memory buffer with the persistent storage media device.

Example 23 may include the at least one computer readable medium of Example 22, comprising a further set of instructions, which when executed by the computing device, cause the computing device to pairing the persistent host memory buffer with the persistent storage media device with one of a soft binding and a permanent binding.

Example 24 may include the at least one computer readable medium of any of Examples 19 to 23, comprising a further set of instructions, which when executed by the computing device, cause the computing device to save a signature in the persistent host memory buffer and the persistent storage media device prior to power down, and verify the saved signatures on power restoration.

Example 25 may include a memory apparatus, comprising means for persistently storing data in a persistent host memory buffer, and means for controlling communication between the persistent host memory buffer and a persistent storage media device.

Example 26 may include the apparatus of Example 25, further comprising means for extending the persistent storage media device with the persistent host memory buffer.

Example 27 may include the apparatus of Example 26, further comprising means for utilizing the persistent host memory buffer as a write-back cache for the persistent storage media device.

Example 28 may include the apparatus of Example 25, further comprising means for pairing the persistent host memory buffer with the persistent storage media device.

Example 29 may include the apparatus of Example 28, further comprising means for pairing the persistent host memory buffer with the persistent storage media device with one of a soft binding and a permanent binding.

Example 30 may include the apparatus of any of Examples 25 to 29, further comprising means for saving a signature in the persistent host memory buffer and the persistent storage media device prior to power down, and means for verifying the saved signatures on power restoration.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory apparatus, comprising:
a persistent host memory buffer; and
a memory controller communicatively coupled to the persistent host memory buffer to control communication between the persistent host memory buffer and a persistent storage media device, wherein the memory controller is further to:
pair the persistent host memory buffer with the persistent storage media device with a soft binding in response to an identification that the persistent storage media device and the persistent host memory buffer are not expected to be permanently connected to each other, and a permanent binding in response to an identification that the persistent storage media device and the persistent host memory buffer are expected to remain permanently connected to each other;
extend the persistent storage media device with the persistent host memory buffer by a utilization of the persistent host memory buffer as a write-back cache for the persistent storage media device only when the permanent binding is used to pair the persistent host memory buffer with the persistent storage media device; and
utilize the persistent host memory buffer as a write-through cache for the persistent storage media device when the soft binding is used to pair the persistent host memory buffer with the persistent storage media device.

2. The apparatus of claim 1, wherein the memory controller is further to:
save a signature in the persistent host memory buffer and the persistent storage media device prior to power down;
attempt to verify the saved signatures on power restoration; and
prevent a power up of the persistent storage media device if the signatures cannot be verified on the power restoration.

3. The apparatus of claim 1, wherein the memory controller is to identify whether or not the persistent storage media device and the persistent host memory buffer are expected to remain permanently connected.

4. A method of controlling memory, comprising:
persistently storing data in a persistent host memory buffer;
controlling communication between the persistent host memory buffer and a persistent storage media device;
pairing the persistent host memory buffer with the persistent storage media device with a soft binding in response to an identification that the persistent storage media device and the persistent host memory buffer are not expected to be permanently connected to each other, and a permanent binding in response to an identification that the persistent storage media device and the persistent host memory buffer are expected to remain permanently connected to each other;
extending the persistent storage media device with the persistent host memory buffer by utilizing the persistent host memory buffer as a write-back cache for the persistent storage media device only when the permanent binding is used to pair the persistent host memory buffer with the persistent storage media device; and
utilizing the persistent host memory buffer as a write-through cache for the persistent storage media device when the soft binding is used to pair the persistent host memory buffer with the persistent storage media device.

5. The method of claim 4, further comprising:
saving a signature in the persistent host memory buffer and the persistent storage media device prior to power down;
attempting a verification of the saved signatures on power restoration; and
preventing a power up of the persistent storage media device if the signatures cannot be verified on the power restoration.

6. The method of claim 4, further comprising identifying whether or not the persistent storage media device and the persistent host memory buffer are expected to remain permanently connected.

7. At least one non-transitory computer readable storage medium, comprising a set of instructions, which when executed by a computing device, cause the computing device to:
- persistently store data in a persistent host memory buffer;
- control communication between the persistent host memory buffer and a persistent storage media device;
- pair the persistent host memory buffer with the persistent storage media device with a soft binding in response to an identification that the persistent storage media device and the persistent host memory buffer are not expected to be permanently connected to each other, and a permanent binding in response to an identification that the persistent storage media device and the persistent host memory buffer are expected to remain permanently connected to each other;
- extend the persistent storage media device with the persistent host memory buffer by a utilization of the persistent host memory buffer as a write-back cache for the persistent storage media device only when the permanent binding is used to pair the persistent host memory buffer with the persistent storage media device; and
- utilize the persistent host memory buffer as a write-through cache for the persistent storage media device when the soft binding is used to pair the persistent host memory buffer with the persistent storage media device.

8. The at least one non-transitory computer readable storage medium of claim 7, comprising a further set of instructions, which when executed by the computing device, cause the computing device to:
- save a signature in the persistent host memory buffer and the persistent storage media device prior to power down;
- attempt a verification of the saved signatures on power restoration; and
- prevent a power up of the persistent storage media device if the signatures cannot be verified on the power restoration.

9. The at least one non-transitory computer readable storage medium of claim 7, comprising a further set of instructions, which when executed by the computing device, cause the computing device to identify whether or not the persistent storage media device and the persistent host memory buffer are expected to remain permanently connected.

10. A memory controller communicatively coupled to a processor, a solid state drive, and a persistent host memory buffer to control communication between the solid state drive and the persistent host memory buffer, wherein the memory controller is to:
- pair the persistent host memory buffer with the solid state drive with a soft binding in response to an identification that the solid state drive and the persistent host memory buffer are not expected to be permanently connected to each other, and a permanent binding in response to an identification that the solid state drive and the persistent host memory buffer are expected to remain permanently connected to each other;
- extend the solid state drive with the persistent host memory buffer by a utilization of the persistent host memory buffer as a write-back cache for the solid state drive only when the permanent binding is used to pair the persistent host memory buffer with the solid state drive; and
- utilize the persistent host memory buffer as a write-through cache for the solid state drive when the soft binding is used to pair the persistent host memory buffer with the solid state drive.

11. The memory controller of claim 10, wherein the memory controller is further to identify whether or not the solid state drive and the persistent host memory buffer are expected to remain permanently connected.

12. The memory controller of claim 10, wherein the memory controller is further to:
- save a signature in the persistent host memory buffer and the solid state drive prior to power down;
- attempt to verify the saved signatures on power restoration; and
- prevent a power up of the solid state drive if the signatures cannot be verified on the power restoration.

* * * * *